United States Patent [19]

Ueda et al.

[11] 4,421,381
[45] Dec. 20, 1983

[54] MECHANICAL VIBRATING ELEMENT

[75] Inventors: Toshitsugu Ueda; Fusao Kohsaka, both of Tokyo, Japan

[73] Assignee: Yokogawa Hokushin Electric Corp., Tokyo, Japan

[21] Appl. No.: 242,627

[22] Filed: Mar. 11, 1981

[30] Foreign Application Priority Data

Apr. 4, 1980 [JP] Japan .................................. 55-44383
May 22, 1980 [JP] Japan .................................. 55-69112

[51] Int. Cl.³ .................. G02B 7/18; G01R 13/38
[52] U.S. Cl. .......................... 350/6.6; 324/97; 333/186; 310/36
[58] Field of Search ............... 310/344, 25, 36; 324/97; 333/167, 186–192; 250/230; 350/6.6, 99

[56] References Cited

U.S. PATENT DOCUMENTS 3,513,391  5/1970  Heinrich et al. ................... 324/97
4,216,402  8/1980  Engdahl ............................ 310/344

Primary Examiner—Marvin L. Nussbaum
Attorney, Agent, or Firm—Parmelee, Bollinger & Bramblett

[57] ABSTRACT

Herein disclosed is a mechanical vibrating element which can be used as a resonator made operative to resonate in a predetermined frequency, a filter having a frequency selecting property or an optical deflector adapted to be mechanically dislocated in accordance with an input signal for deflecting an optical beam. The mechanical vibrating element according to the present invention is characterized in that a single insulating substrate constructs a frame and a moving portion supported by the frame, in that the moving portion is formed with a conductive pattern or a coil, and in that an electric current is fed to the conductor or the coil, while appling a magnetic field in the same direction as the plane direction of the insulating substrate, so that the moving portions may be mechanically vibrated.

12 Claims, 27 Drawing Figures

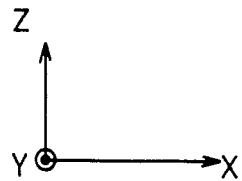
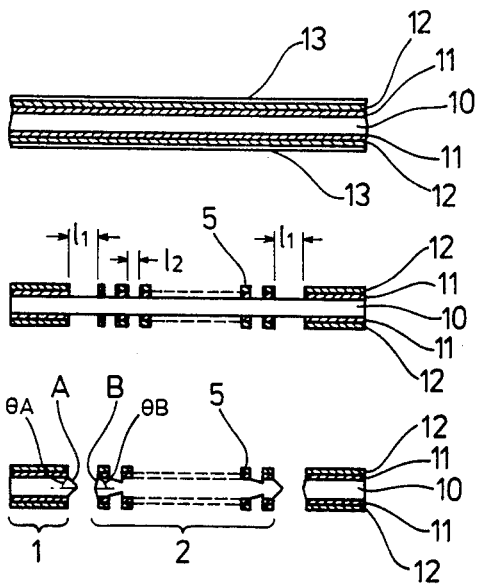
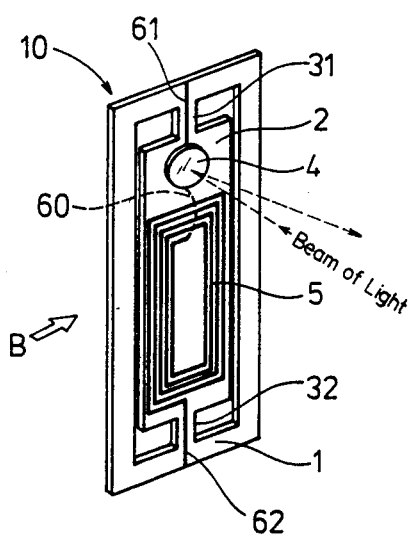
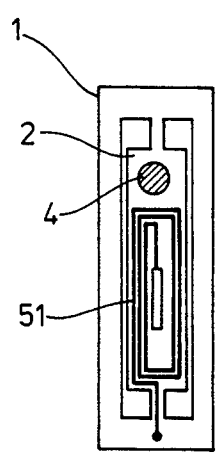
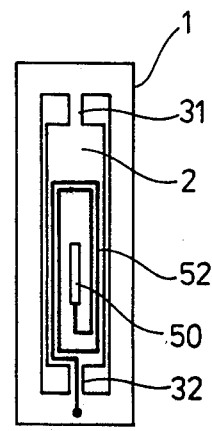

FIG.14
FIG.15
FIG.16
FIG.17
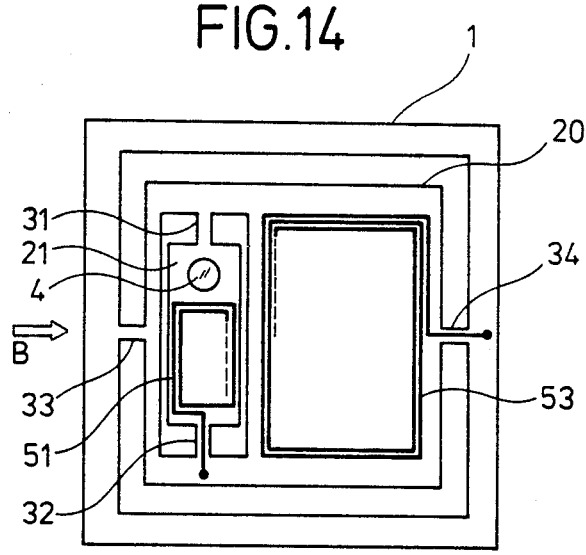
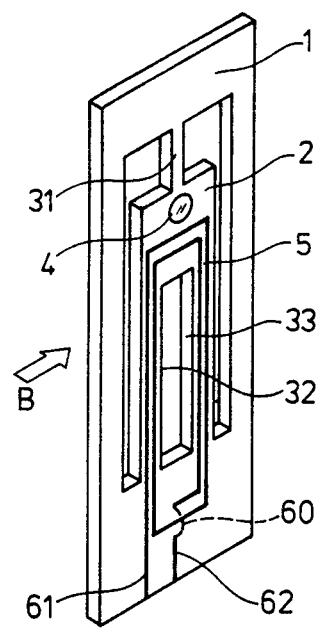
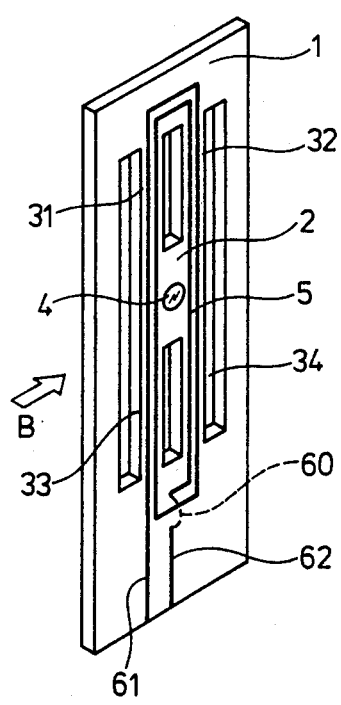
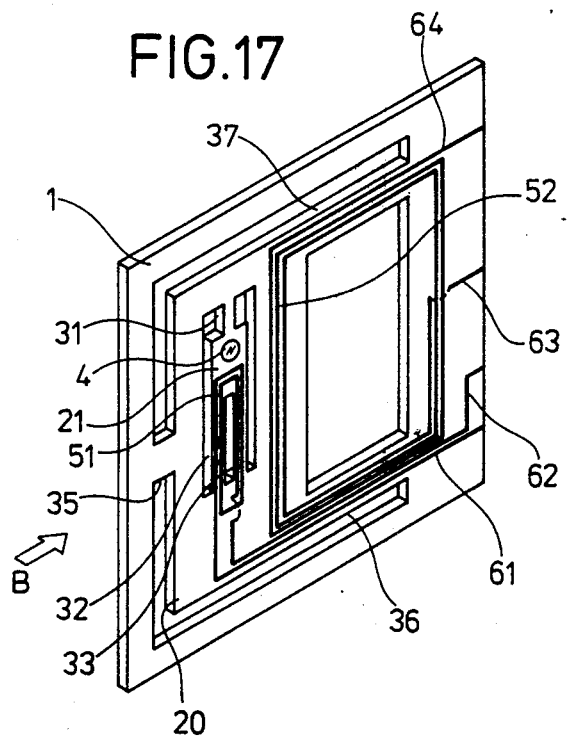

MECHANICAL VIBRATING ELEMENT

BACKGROUND OF THE INVENTION

1. Field of the Invention

The present invention relates to a mechanical vibrating element which can be used as a resonator made operative to resonate in a predetermined frequency, a filter having a frequency selecting property or an optical deflector adapted to be mechanically dislocated in accordance with an input signal for deflecting an optical beam so that it can be used in an electromagnetic oscillograph, for example. More particularly, the present invention relates to a mechanical vibrating element which is characterized in that an insulating substrate constructs a frame and a moving portion supported on the frame through a spring portion, in that the moving portion is formed with a conductive pattern or a coil, in that the insulating substrate is arranged in a magnetic field which is oriented in the same direction as the plane direction of that substrate, in that an electric current is fed to the conductor or the coil so that the moving portion may be mechanically vibrated.

2. Description of the Prior Art

As an applied example of a mechanical vibrating element, there is an optical deflector in which a mirror is attached to a moving portion thereby to deflect an optical beam. FIG. 1 is a perspective view showing the construction of one example of the optical deflector which is used in a conventionally known electromagnetic oscillograph. This optical deflector is constructed such that a reflecting mirror 4 and a coil 5 for generating a torsional torque are adhered to a ligament 3 acting as a torsion spring 3. The coil 5 is arranged in a magnetic field so that a torsional torque is generated by feeding the coil 5 with a current i, whereby the reflecting mirror 4 is dislocated. As a result, the light incident upon the reflecting mirror 4 can be deflected by the current flowing through the coil 5. The optical deflector having the construction thus far described is fabricated by the manual works such as the formation of the coil 5 or the attachment of the coil or the reflecting mirror to the ligament and has disadvantages that the quality and performance become irregular and that the price becomes high.

SUMMARY OF THE INVENTION

The present invention has been conceived in view of the disadvantages concomitant with the element of the prior art and contemplates to realize an inexpensive mechanical vibrating element which has a high performance and a high and regular quality. The present invention further contemplates to realize a mechanical vibrating element of the type, in which a number of elements having the same standard can be simultaneously fabricated.

BRIEF DESCRIPTION OF THE DRAWINGS

FIGS. 11(a) through 11(d) represent simplified views showing one example of the method of fabricating the mechanical vibrating element shown in FIG. 2;

FIGS. 12 to 19 are views showing other constructions of the mechanical vibrating element according to the present invention in case the optical deflectors are constructed;

DESCRIPTION OF THE PREFERRED EMBODIMENTS

Figure 1:
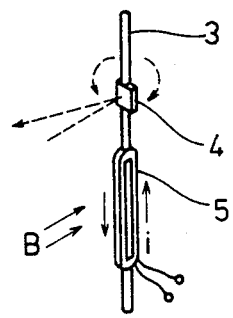
FIG. 1 is a perspective view showing the construction of an optical deflector which is one example of the application of a mechanical vibrating element according to the prior art.
Figure 2:
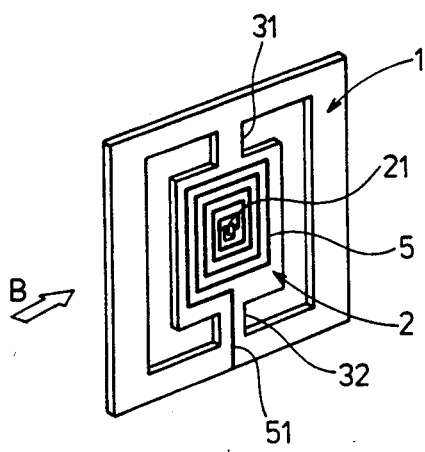
FIG. 2 is a perspective view showing the construction of one embodiment of the present invention.

FIG. 2 is a perspective view showing the construction of one embodiment of the present invention. Reference numerals 1 and 2 indicate a frame and a moving portion which is supported upon the frame 1 through thinned spring portions 31 and 32. Those frame 1, moving portion 2 and spring portions 31 and 32 are constructed of a single insulating substrate. Here, a quartz substrate, an Si substrate or a glass substrate having a thickness of about $5 \times 10^{-5}$ m, for example, can be used as the insulating substrate. Indicated at numeral 5 are coil patterns which are formed on both the sides of the moving portion 2 and which are electrically connected through a through hole 21 formed at the center of the moving portion 2. Indicated at numeral 51 are the lead wires of the coil 5, which are led out through the spring portion 32 and which are mounted on both the front and back sides.

The mechanical vibrating element thus constructed is arranged in such a magnetic field as is oriented in a direction indicated at arrow B (which is the same as the plane direction of the insulating substrate), and the coil patterns 5 are fed with an electric current through the lead wires 51. Then, a torsional torque is applied to the moving portion 2. Moreover, the moving portion 2 can be vibrated in an intrinsic frequency f by connecting a negative resistor with the coil patterns 5 of that mechanical vibrating element.

Figure 3:
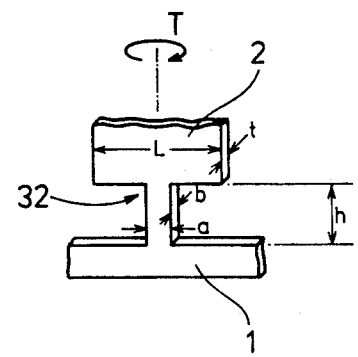
FIG. 3 is a perspective view showing the sizes of the moving part, the spring portion and their vicinities of FIG. 2.

Now, if the torque, which is generated at the moving portion 2 when the coil patterns 5 are fed with the current, is denoted at T and if the sizes of the spring portions 31 and 32 of the moving portion 2 are preset, as shown in FIG. 3, the relationship between the deflection angle $\theta$ of the moving portion 2 and the torque T can be expressed by the following equation (1):

$$\theta = \frac{1}{k} \cdot \frac{h}{a \cdot b^3} \cdot \frac{T}{G} \tag{1}$$

wherein:

k: Constant,
a: Width of Spring Portion 32;
b: Thickness of Spring Portion 32;
h: Length of Spring Portion 32; and
G: Rigidity Coefficient.

Moreover, if the rotational moment of inertia of the moving portion 2 is denoted at J, the intrinsic vibrations of the mechanical system satisfy the differential equation (2), as follows:

$$J \frac{d^2\theta}{dt^2} + A\theta = 0, \quad (2)$$

wherein:
$J = (m \cdot L^2)/12$ (m: Total Mass of Moving Portion; and L: Width of Moving Portion);
A: Spring Constant $(=2/h \cdot k \cdot ab^3 \cdot G)$ of Spring Portions 31 and 32.

From the equation (2), the intrinsic frequency f of the moving portion 2 can be expressed by the equation (3) so that a frequency oscillator having an excellent frequency stability can be provided:

$$f = \frac{1}{2\pi} \sqrt{\frac{A}{J}}. \quad (3)$$

Here, in case the moving portion 2 is made to vibrate in a gas or liquid, it vibrates the surrounding gas or liquid together. As a result, the equivalent value of the rotational moment of inertia of the moving portion 2 is varied so that the intrinsic frequency f of the moving portion 2 is accordingly varied. Since the variation of the equivalent value of the rotational moment of inertia is in proportion to the density or viscosity of the gas or liquid surrounding the moving portion 2, the variation of the intrinsic frequency f corresponds to the density or viscosity of the gas or liquid. As a result, the density or viscosity of the gas or liquid surrounding the moving portion 2 can be informed by measuring the intrinsic frequency f of the moving portion 2.

Figure 4:
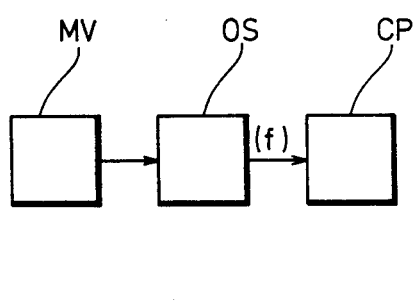
FIG. 4 is a block diagram showing the construction in case a densimeter is constructed.
Figure 5:
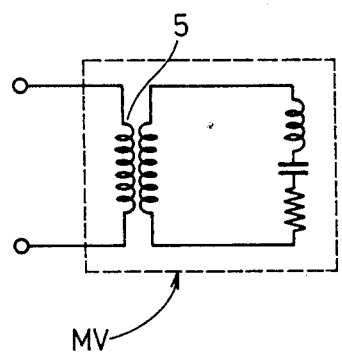
FIG. 5 is a diagram showing an equivalent circuit of a mechanical vibrating element.

FIG. 4 is a block diagram showing the construction in case a densimeter is constructed including that mechanical vibrating element. Reference letters MV generally indicate the mechanical vibrating element, the equivalent circuit of which is expressed by a series resonance circuit composed of an inductance, a condenser and a resistor, as shown in FIG. 5. Letters OS indicate an oscillating circuit, which constructs a self-oscillating circuit, for example, while including the mechanical vibrating element MV and the oscillatory frequency f of which corresponds to the density or viscosity of the gas or liquid surrounding the mechanical vibrating element. Letters CP indicate an arithmetic circuit which is constructed of a micro-processor and which is made receptive of the oscillatory frequency f from the oscillating circuit OS so that a signal relating to the density or viscosity is obtained by the arithmetic calculation.

If, in the equation (3), the variation of the rotational moment of inertia of the moving portion 2, which corresponds to the density, for example, is denoted at $\Delta J$, the intrinsic frequency f can be given by the following equation (4) so that the signal relating to the density is obtained by the use of the equation (4):

$$f = \frac{1}{2\pi} \sqrt{\frac{A}{J_0 \left(1 + \frac{\Delta J}{J_0}\right)}} \quad (4)$$

$$= f_0 \left(1 + \frac{\Delta J}{J_0}\right)^{-\frac{1}{2}},$$

wherein: $\Delta J \propto$ Density.

FIGS. 6, 7, 9 and 10 are views showing other constructions of the mechanical vibrating element according to the present invention.

Figure 6:
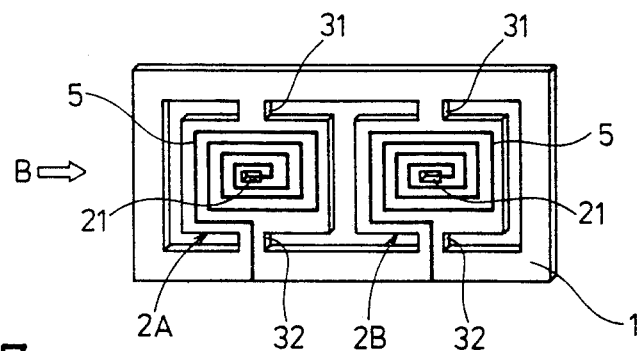
FIGS. 6, 7, 9 and 10 are views showing other constructions of the mechanical vibrating element according to the present invention.

The embodiment shown in FIG. 6 is constructed such that two moving portions 2A and 2B are supported upon the frame 1 by means of the spring portions 31 and 32, respectively. Here, the shapes of the two moving portions 2A and 2B may be either identical or different. If, in this construction, the intrinsic frequencies of the moving portions 2A and 2B are denoted at $f_A$ and $f_B$, respectively, the errors due to the temperature characteristics of the mechanical vibrating element itself can be reduced by taking the difference or ratio of the frequencies $f_A$ and $f_B$.

Figure 7:
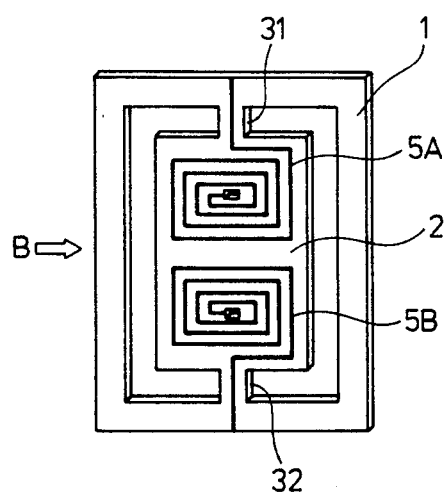

The embodiment shown in FIG. 7 is so constructed to have four terminals that the moving portion 2 is supported upon the frame 1 through the spring portions 31 and 32 and that the moving portion 2 is formed with two coils 5A and 5B.

Figure 8:
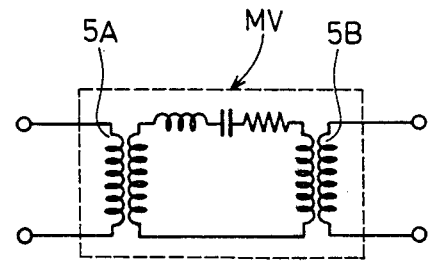
FIG. 8 is a diagram showing an equivalent circuit of the mechanical vibrating element of FIG. 7.

FIG. 8 shows the equivalent circuit of the mechanical vibrating element of FIG. 7, in which the two coils 5A and 5B are coupled through the resonance circuit of the mechanical vibrating element, so that it can be made to act as a mechanical filter having selecting characteristics in the resonance frequency (which corresponds to the intrinsic frequency of the mechanical vibrating element) of that resonance circuit and so that a filter having a wider band can be provided by combining a plurality of vibrating elements having different intrinsic frequencies.

Figure 9:
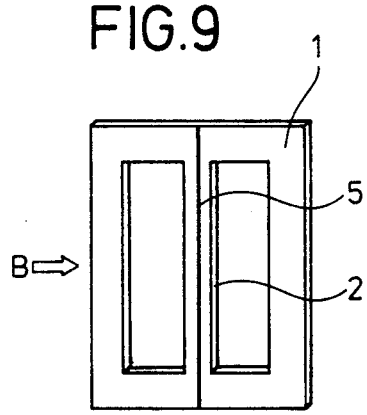

The embodiment shown in FIG. 9 is constructed such that the moving portion 2 is made of a band-shaped beam which has the same width and which is supported on the frame 1 and such that the moving portion 2 itself is bent to vibrate while using as its node the point at which it is supported on the frame 1. Moreover, that moving portion 2 is formed with a single conducting pattern (i.e., the coil pattern) 5.

Figure 10:
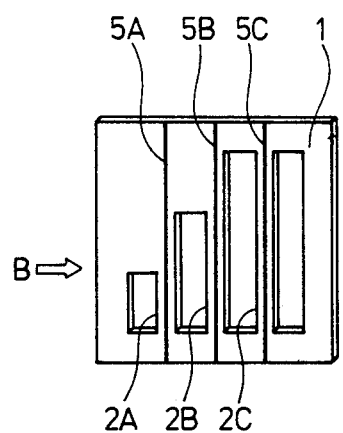

The embodiment shown in FIG. 10 is constructed such that the moving portions 2A, 2B and 2C made of three band-shaped beams having different lengthes are constructed of a single substrate. The respective moving portions 2A, 2B and 2C are bent to vibrate in the respectively different intrinsic frequencies so that this construction is advantageous in case it is applied to a mechanical filter. On the other hand, this construction can be similarly made in the case of FIG. 2.

FIG. 11 is a simplified process chart showing one example of the method of fabricating the mechanical vibrating element shown in FIG. 2. Here, the quartz plate, the Si substrate, glass or the like, which can be anisotropically etched, is used as the insulating substrate. The example to be described corresponds to the case, in which a Z plate of quartz is used. FIG. 11(a) illustrates a coordinate which has the directions of the optical axis Z, the mechanical axis Y and the electric axis X of that quartz substrate 10. Indicated at numeral 11 is a first mask material layer, which coats that quartz substrate 10, e.g., a Cr or Ni layer. Indicated at numeral 12 is a second mask material layer, which coats the first mask layer 11, e.g., an Au layer.

First of all, as shown in FIG. 11(b), the quartz substrate 10 has its both sides coated consecutively with the first mask material layers 11 and the second mask material layers 12 and further with resist layers 13. Here, the coating of the first and second mask material layers 11 and 12 can be performed by the sputtering and evaporating processes, respectively. On the other hand, it is sufficient that the resist layers 13 are applied.

Next, as shown in FIG. 11(c), the shapes of the coil patterns, the frame 1, the moving portion 2, the spring portions 31 and 32, and the through hole 21, all of which are to be formed on the quartz substrate 10, are made by the techniques of the photolithography. Here, whether the quartz substrate 10 is cut away or left under a continuing condition is suitably selected in advance by the gaps $l_1$ and $l_2$ between the patterns.

Subsequently, the quartz substrate 10 thus prepared is dipped in a quartz treating agent such as an aqueous solution of hydrofluoric acid so that it is etched. Then, the quartz substrate 10 shown in FIG. 11(d) is selectively removed so that the quartz oscillator having a preset shape can be completed.

Here, the reason why the etching process is performed in the manner shown in FIG. 11(d) is as follows. Specifically, the etching rate of the quartz substrate 10 in the direction of its Z axis is several times as high as that of the crystal planes A and B shown in FIG. 11(d), and in this case the shown angles $\theta A$ and $\theta B$ take values of 30 degrees and 80 degrees, respectively, so that the transverse etching will not advance any more. From this reasoning, in case the quartz substrate 10 is cut away, the gap $l_1$ between the patterns may be selected to satisfy the following inequality:

$$l_1 > \frac{t}{2} \cdot [\tan(90 - \theta A) + \tan(90 - \theta B)],$$

wherein: t: Thickness of Quartz Substrate 10. In case, on the other hand, the quartz substrate 10 is left under a continuing condition, the gap $l_2$ between the patterns may be selected to satisfy the following inequality:

$$l_2 < \frac{t}{2} \cdot [\tan(90 - \theta A) + \tan(90 - \theta B)].$$

In this instance, incidentally, although the above inequalities correspond to the case in which the etching process is performed from both the sides, the etching process can be from one side. In this one side etching case, the gaps $l_1$ and $l_2$ are determined twice as large as the aforementioned values.

The fabricating process thus far described has an advantage that the formations of the coil pattern and the shapes of the frame and the moving portion can be realized with a reduced number of steps and in multiplicity at the same time. Moreover, the same treatment can be effected even if the pattern for forming the shape of the vibrating element and the pattern for preparing the coil are separately formed.

As has been described hereinbefore, according to the present invention, the frame, the moving portion and so on are formed of the single insulating substrate so that a number of elements having a high performance and a uniform quality can be fabricated at the same time, thus making it possible to realize an inexpensive mechanical vibrating element.

Other examples of the constructions of the mechanical vibrating element according to the present invention are shown in FIGS. 12 to 19, all corresponding to the cases, in which a mirror is attached to the moving portion thereby to construct an optical deflector for deflecting an optical beam.

The embodiment shown in FIG. 12 is constructed such that the moving portion 2 is supported on the frame 1 through the thinned spring portions 31 and 32 while being formed with the mirror 4 and the coil 5. Here, all of the frame 1, the moving portion 2 and the spring portions 31 and 32 are constructed of the single insulating substrate (e.g., a quartz substrate having a thickness of about $5 \times 10^{-5}$ m), and the overall shape of these, the shape of the moving portion, and the mirror 4 and the coil 5 are all formed by using the aforementioned photolithographic and etching techniques. The coil 5 is connected with lead wires 61 and 62 through a jumper wire 60 which is connected in a manner to jump that coil 5.

If the optical deflector thus constructed is operated such that the coil pattern 5 is arranged in the magnetic field B, as shown, and such that the coil pattern 5 is fed with an electric current through the lead wires 61 and 62 and through the jumper wire 60, the moving portion 2 is dislocated about the spring portions 31 and 32 so that the optical beam coming to the reflecting mirror can be deflected by the current flowing through the coil 5.

FIGS. 13(a) and 13(b) are a front elevation and a back elevation, respectively. In the embodiment shown therein, the coil patterns 51 and 52 are formed on both the sides of the moving portion 2. These coil patterns 51 and 52 formed on both the sides are electrically connected through a hole 50 which is formed substantially at the center of the moving portion 2.

The embodiment shown in FIG. 14 is constructed such that a first moving portion 20 is formed in the frame 1 through spring portions 33 and 34 and such that a second moving portion 21 is formed in that first moving portion 20 through the spring portions 31 and 32. The second moving portion 21 is formed with the reflecting mirror 4 and the coil pattern 51, whereas the first moving portion 20 is formed with a coil pattern 53. The torques to be imparted to those coil patterns 51 and 53 act at a right angle with respect to each other when placed in the magnetic field which is oriented in the same direction as the plane of the insulating substrate. As a result, the optical deflector according to the embodiment under consideration can deflect the beam coming to the reflecting mirror 4 simultaneously in the directions of the X and Y axes.

The embodiment shown in FIG. 15 is constructed such that the moving portion 2 is supported on the frame 1 through the spring portions 31, 32 and 33 and such that the coil pattern 5 is formed to extend over the moving portion 2, the spring portions 32 and 33 and the frame 1, thus making it easy to lead out the lead wires 61 and 62.

The embodiment shown in FIG. 16 is constructed such that the moving portion 2 is supported by the four spring portions 31 to 34 and such that the coil pattern 5 is formed to extend over the respective spring portions 31 to 34, the frame 1 and the moving portion 2.

The embodiment shown in FIG. 17 is constructed such that the first moving portion 20 is formed in the frame 1 through first spring portions 35, 36 and 37 and such that the second moving portion 21 is formed in that first moving portion 20 through the second spring portions 31, 32 and 33. The second moving portion 21 is formed with the reflecting mirror 4, and the coil pattern 51 is formed to extend over the second moving portion, the spring portions 32 and 33 and the first moving portion, whereas the coil pattern 52 is formed to extend over the first moving portion 20, the spring portion 36, 37 and the frame 1. The torques to be imparted to those coil patterns 51 and 52 act at a right angle with respect to each other when placed in a magnetic field. As a result, the optical deflector according to this embodiment can deflect the beam coming to the reflecting mirror 4 simultaneously in the directions of the X and Y axes.

Figure 18:
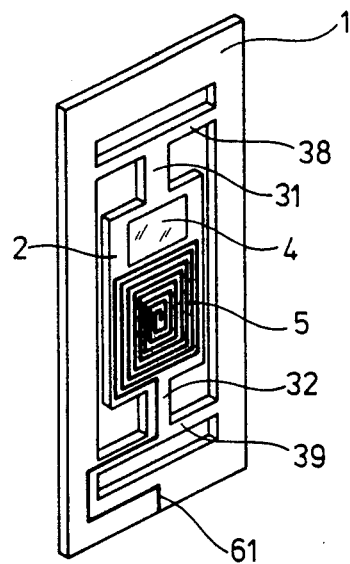

The embodiment shown in FIG. 18 is modified from the optical deflector having the construction shown in FIG. 12 or 13 such that the spring portions 31 and 32 supporting the moving portion 2 are fixed to the frame 1 through extension and contraction absorbing spring portions 38 and 39.

Figure 19:
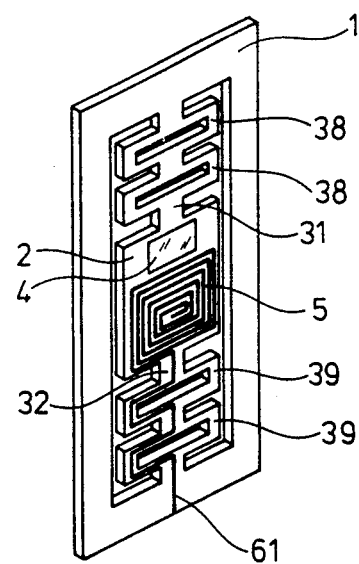

The embodiment shown in FIG. 19 are so constructed that the extension and contraction absorbing spring portions 38 and 39 are provided midway of the spring portions 31 and 32 supporting the moving portion 2.

If the coil 5 is fed with a current, there rises a fear that the Joule heat of $i^2 \cdot R$ is generated by the current i flowing therethrough and the resistance R of the coil so that a mechanical strain is established in the moving portion 2. The construction, in which the extension and contraction absorbing spring portions 38 and 39 are providing in the spring portions 31 and 32 as in the embodiments shown in FIGS. 18 and 19, function to absorb the wap and strain of the moving portion 2 due to the heat generated by the current flowing through the coil.

Figure 20:
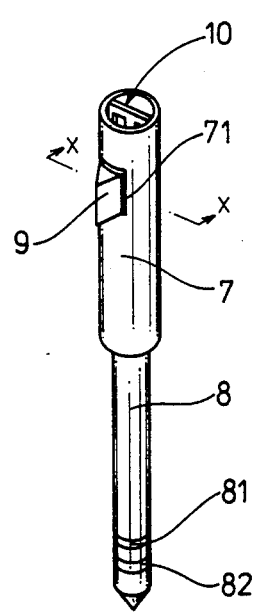
FIG. 20 a perspective view showing the construction of the optical deflector which is convenient in case a number of optical deflecting elements are arranged when used.
Figure 21:
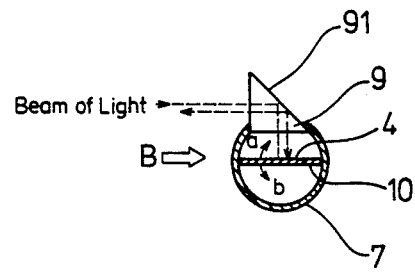
FIG. 21 is a section taken along line X—X of FIG. 20.

FIG. 20 is a perspective view showing the construction of the optical deflector which is convenient in case the optical deflecting elements thus constructed are arranged simultaneously in multiple numbers when used. FIG. 21 is a section taken along line X—X of FIG. 20. Reference numeral 7 appearing in those Figures indicates a protecting case which is wholly formed into a cylindrical shape. Indicated at numeral 8 is a connector portion which is disposed below that protecting case 7 and which is equipped with connecting rings 81 and 82 connected electrically with a not-shown outside circuit. Indicated at numeral 10 is the optical deflecting element having the construction shown in FIG. 12, for example, which element is fitted in the protecting case 7 such that the frame 1 is fixed to the protecting case by means of an adhesive or the like. Indicated at numeral 9 is a prism which is attached to an aperture 71 formed in the protecting case 7 so that the optical beam coming to the prism 9 is reflected in the prism 9 until it is guided into the reflecting mirror 4 of the optical deflecting element 10. Incidentally, the prism 9 has its reflecting surface 91 evaporated with metal or the like so that the incident beam and the beam reflected from the reflecting mirror 4 may be efficiently reflected.

Figure 22:
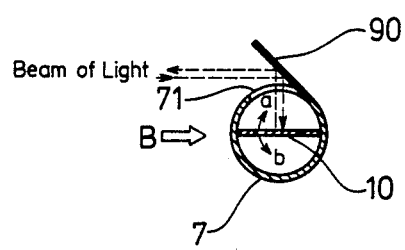
FIG. 22 is another section.

FIG. 22 is a sectional view showing another embodiment of the optical deflector. In this embodiment, the prism 9 of FIG. 21 is replaced by a mirror 90 which is attached to the aperture 71.

Figure 23:
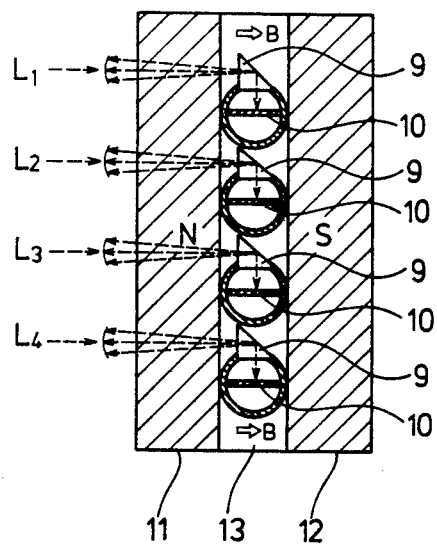
FIG. 23 is a view showing the overall construction in case a number of optical detectors are arranged when used.

FIG. 23 is a view showing the overall construction in case a number of the optical deflectors thus constructed are arranged. Here, there is shown the case, in which four optical deflectors are used. Indicated at numerals 11 and 12 appearing in FIG. 23 are a pair of magnets which are arranged in parallel with each other through a gap 13. A magnetic field oriented in the direction of the shown arrow B is established in the gap 13, in which the numerous optical deflectors are arranged, as shown. In each of the optical deflectors, more specifically, the optical deflecting element is arranged between the magnets 11 and 12 in parallel with the others (such that their surfaces formed with the reflecting mirrors 4 and the coil patterns 5 are arranged in parallel).

Optical beams $L_1$ to $L_4$ are given in parallel to the respective optical deflectors so that they are reflected by the respective prisms 9 until they enter the respective reflecting mirrors 4. These reflecting mirrors 4 of the respective optical deflecting elements are dislocated in the directions of arrows a and b (as shown in FIGS. 21 and 22) in a manner to correspond to the currents flowing through the respective coil patterns 5. The optical beams incident upon the reflecting mirrors 4 are reflected thereby so that the reflected beams are again reflected by the prisms 9 to emanate therefrom.

Therefore, if plural sheets of photosensitive paper are arranged at one side where the reflected beams come out, the waveforms of plural electric signals can be optically recorded simultaneously in parallel.

Incidentally, although the forgoing embodiments have been described by way of the element to be used of the electromagnetic oscillograph, the present invention can be applied a variety of fields including the optical deflector for scanning the optical beam.

As has been described hereinbefore, according to the present invention, the frame, the spring coupled with that frame, and the moving portion supported by that spring are constructed of the single substrate, and the formations of the shapes of those frame, the spring portion and the moving portion and the formations of the coil pattern and the reflecting mirror to be provided on that moving portion are both performed by the use of the photolithographic and etching techniques. Thus, it is possible to mass-produce a number of optical deflecting elements having a high performance and a regular quality at the same time and to reduce the production cost for one element.

What is claimed is:

1. A mechanical vibrating element characterized: in that a frame and a moving portion supported by said frame are constructed of a single insulating substrate; in that said moving portion is formed with one or more coils or conductive patterns; in that both the formations of said frame and said moving portions and the formations of said coils or said conductive patterns are made by photolithographic and etching techniques and in that a current is fed to said coils or conductors, while imparting a magnetic field in the same direction as the plane direction of said insulating substrating, so that said moving portion may be mechanically vibrated.

2. A mechanical vibrating element as set forth in claim 1, further characterized in that said moving portion is supported on said frame through a spring portion.

3. A mechanical vibrating element as set forth in claim 1, further characterized in that at least two moving portions are supported on said frame.

4. A mechanical vibrating element as set forth in claim 1, further characterized in that said moving portion is constructed of a band-shaped beam which is supported by said frame and which is bent to vibrate.

5. A mechanical vibrating element as set forth in claim 1, further characterized in that the variation of the frequency of said moving portion is detected to perform a function as physical property detecting means.

6. A mechanical vibrating element as set forth in claim 1, further characterized in that said insulating substrate is made of such a material as can be anisotropically etched.

7. A mechanical vibrating element for optical deflection, characterized: in that at least spring portions and a moving portion supported by said spring portions are constructed of a single insulating substrate; in that said moving portion is provided with a reflecting mirror and a coil pattern; and in that both the formations of the shapes of said spring portions and said moving portion and the formations of said reflecting mirror and said coil pattern are performed by using the photolithographic and etching techniques.

8. A mechanical vibrating element as set forth in claim 7, further characterized; in that said moving portion is formed with another moving portion which is supported by other spring portions; and in that the second-named moving portion is formed with another coil pattern and another reflecting mirror.

9. A mechanical vibrating element for optical deflection, characterized: in that a frame portion, spring portions connected to said frame portion, and a moving portion supported by said spring portions are constructed of a single insulating substrate; in that said moving portion is equipped with both a reflecting mirror and a coil pattern which is formed to extend over said moving portion, said spring portions and said frame portion; and in that both the formations of the shapes of said spring portions and said moving portion and the formations of said reflecting mirror and said coil pattern are performed by using the photolithographic and etching techniques.

10. A mechanical vibrating element as set forth in claim 9, further characterized: in that said moving portion is formed a second moving portion which is supported by second spring portions; and in that a second coil pattern is formed to extend over the second-named moving portion, the second-named spring portions and the first-named moving portion.

11. A mechanical vibrating element characterized: in that a frame portion, spring portions connected to said frame portion, extension and contraction absorbing spring portions formed midway of said spring portions, and a moving portion supported by said spring portions are constructed of a single insulating substrate; said moving portion is formed with one or more coils or conductive patterns; and in that a coil is fed to said coils or conductors, while imparting a magnetic field which is in the same direction as the plane direction of said insulating substrate, so that said moving portion may be mechanically vibrated.

12. A mechanical vibrating element for optical deflection, characterized in that an optical deflecting element, in which at least a frame, spring portions connected to said frame, and a moving portion supported by said spring portions are constructed of a single insulating substrate, and in which said moving portion is provided with a reflecting mirror and a coil pattern, is accommodated in a protecting case which is formed with an aperture at its portion corresponding to said reflecting mirror and which is equipped with a prism or mirror mounted in said aperture for changing the direction of an optical beam.

* * * * *